(12) United States Patent
Shi et al.

(10) Patent No.: US 10,743,413 B2
(45) Date of Patent: Aug. 11, 2020

(54) FLEXIBLE SUBSTRATE AND METHOD FOR MANUFACTURING SAME

(71) Applicant: SHENZHEN CHINA STAR OPTOELECTRONICS TECHNOLOGY CO., LTD., Guangdong (CN)

(72) Inventors: Yu Shi, Guangdong (CN); Lixuan Chen, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 15/761,099

(22) PCT Filed: Mar. 5, 2018

(86) PCT No.: PCT/CN2018/077963
§ 371 (c)(1),
(2) Date: Mar. 18, 2018

(87) PCT Pub. No.: WO2019/153394
PCT Pub. Date: Aug. 15, 2019

(65) Prior Publication Data
US 2019/0246497 A1     Aug. 8, 2019

(51) Int. Cl.
*G06F 1/16*     (2006.01)
*H05K 1/03*     (2006.01)
(Continued)

(52) U.S. Cl.
CPC ......... *H05K 1/0393* (2013.01); *G06F 1/1652* (2013.01); *G09F 9/301* (2013.01);
(Continued)

(58) Field of Classification Search
CPC .................................................... G06F 1/1652
See application file for complete search history.

(56) References Cited

U.S. PATENT DOCUMENTS

| 2009/0008667 A1* | 1/2009 | Fujii | H01L 51/0005 |
| | | | 257/98 |
| 2013/0181200 A1* | 7/2013 | Murata | H01L 27/1225 |
| | | | 257/40 |

(Continued)

FOREIGN PATENT DOCUMENTS

| CN | 104823298 A | 8/2015 |
| CN | 105408949 A | 3/2016 |
| CN | 105552247 A | 5/2016 |

*Primary Examiner* — Hoa C Nguyen
(74) *Attorney, Agent, or Firm* — Mark M. Friedman

(57) ABSTRACT

The present disclosure provides a method for manufacturing a flexible substrate. The method includes forming at least two flexible substrate layers in a stacking form on a surface of a glass baseplate, wherein a first flexible substrate layer of the flexible substrate layers relatively close to the glass baseplate has a refractive index less than a refractive index of a second flexible substrate layer of the flexible substrate layers relatively far from the glass baseplate; forming a water and oxygen blocking layer on a surface of the second flexible substrate layers, wherein the water and oxygen blocking layer has a refractive index greater than the refractive index of the second flexible substrate layers disposed below the water and oxygen blocking layer.

1 Claim, 1 Drawing Sheet

(51) Int. Cl.
*H01L 25/065* (2006.01)
*H01L 51/00* (2006.01)
*G09F 9/30* (2006.01)
*H01L 25/075* (2006.01)

(52) U.S. Cl.
CPC ........ *H01L 25/0657* (2013.01); *H01L 25/075* (2013.01); *H01L 51/0097* (2013.01)

(56) References Cited

U.S. PATENT DOCUMENTS

| | | |
|---|---|---|
| 2015/0303389 A1 | 10/2015 | Kim et al. |
| 2016/0197307 A1* | 7/2016 | Cheng ................ H01L 51/5275 257/40 |
| 2016/0204365 A1 | 7/2016 | Choi et al. |
| 2016/0218165 A1* | 7/2016 | Park ................... H01L 27/3276 |
| 2017/0162825 A1 | 6/2017 | Xiao et al. |

* cited by examiner

FLEXIBLE SUBSTRATE AND METHOD FOR MANUFACTURING SAME

FIELD OF INVENTION

The present disclosure relates to the field of display technology, and more particularly to a flexible substrate and a method for manufacturing the same.

BACKGROUND

Flexible displays are light weight, pliable, non-fragile, and inexpensive, and therefore flexible displays are widely used in different types of electronic products. Flexibility technology thus have become a main development direction for the displays. Currently, flexible displays include organic light-emitting diode (OLED) display, liquid crystal display (LCD), flexible electrophoresis display (EPD), micro LED, etc. Materials and techniques used for manufacturing flexible substrate/cover plate are crucial parts for producing these displays. According to prior art, polyimide (PI) is primarily used as a flexible substrate, because polyimide has excellent properties including chemical stability, radiation resisting ability, heat resisting ability, and dielectric properties.

Although a polymer substrate has lower light transmittance than a glass substrate having the same thickness as the polymer substrate, decreasing thickness of the polymer substrate can mitigate this unfavorable disadvantage. On the other hand, with a polymer substrate being used, reducing light reflecting effect can raise light transmittance, thus increasing brightness.

Conventionally, it is known to manufacture the flexible substrate by adopting a multi-film structure and by optimizing refractive index and film thickness of each film, and this design can achieve decrease in reflectivity and increase in transmittance. Chemical vapor deposition (CVD) or physical vapor deposition (PVD) are generally used to form inorganic materials or organic materials on the baseplate. The anti-reflection coating film formed by this method is anisotropic and microscopically uniform, and has high purity, little residual stress, and excellent pliability. This method is the main one of those for forming the anti-reflection coating film. However, the manufacturing process of this method is much more complicated and requires much higher production cost.

Therefore, the conventional process for manufacturing the flexible substrate, though light transmittance of the flexible substrate is increased, is much more complicated and requires much higher production cost, and does not satisfy requirements of scale-up production.

SUMMARY OF DISCLOSURE

The present disclosure provides a flexible substrate and a method for manufacturing the same, which includes formation of a plurality of layers having different refractive indexes, so as to improve light transmittance of the flexible substrate. The present disclosure solves the problems encountered by the prior art, where the conventional process for manufacturing the flexible substrate, though light transmittance of the flexible substrate is increased, is much more complicated and requires much higher production cost, and does not satisfy requirements of scale-up production.

To solve the above mentioned problems, the present disclosure provides the following technical schemes.

In a first aspect, the present disclosure provides a method for manufacturing a flexible substrate, including:

a step S10 of providing a glass baseplate;

a step S20 of forming at least two flexible substrate layers in a stacking form on a surface of the glass baseplate, wherein a first flexible substrate layer of the flexible substrate layers relatively close to the glass baseplate has a refractive index less than a refractive index of a second flexible substrate layer of the flexible substrate layers relatively far from the glass baseplate;

a step S30 of forming a water and oxygen blocking layer on a surface of the second flexible substrate layers, wherein the water and oxygen blocking layer has a refractive index greater than the refractive index of the second flexible substrate layers disposed below the water and oxygen blocking layer, and the water and oxygen blocking layer is made of a material selected from silicon nitride, aluminum oxide, titanium oxide, zirconia, or any combination thereof; and a step S40 of removing the glass baseplate, such that the flexible substrate having a high transmittance is formed.

In accordance with one preferred embodiment of the present disclosure, the flexible substrate layers are made of polyimide.

In accordance with one preferred embodiment of the present disclosure, the step S20 includes:

a step S201 of forming a first polyimide layer on the surface of the glass baseplate; and a step S202 of forming a second polyimide layer on a surface of the first polyimide layer.

In accordance with one preferred embodiment of the present disclosure, the step S201 includes:

providing 4,4'-diaminodiphenyl ether as a diamine, and 4,4'-(hexafluoroisopropylidene)diphthalic anhydride and pyromellitic dianhydride as dianhydrides, and then dissolving 4,4'-diaminodiphenyl ether, 4,4'-(hexafluoroisopropylidene)diphthalic anhydride and pyromellitic dianhydride in N-methylpyrrolidone, so as to form a first polyamic acid solution containing 10-14% of fluorine, wherein a solid content of the first polyamic acid solution is 10-14%;

coating the first polyamic acid solution on the surface of the glass baseplate; and heating a coating layer of the first polyamic acid solution, wherein a heating temperature is ramped up to 300-400° C. in accordance with a predetermined procedure, so as to cure the coating layer of the first polyamic acid solution to form the first polyimide layer; and the step S202 includes:

dissolving 4,4'-(diphenylsulfonyl(4,1-benzene)disulfide)diphenylamine and 3,3',4,4'-biphenyltetracarboxylic dianhydride of same moles in N-methylpyrrolidone, so as to form a second polyamic acid solution, wherein a solid content of the second polyamic acid solution is 13-17%;

coating the second polyamic acid solution on a surface of the first polyimide layer; and heating a coating layer of the second polyamic acid solution, wherein the heating temperature is ramped up to 300-350° C. in accordance with the predetermined procedure, so as to cure the coating layer of the second polyamic acid solution to form the second polyimide layer.

In accordance with one preferred embodiment of the present disclosure, the step S201 includes:

providing 4,4'-diaminodiphenyl ether as a diamine, and 4,4'-(hexafluoroisopropylidene)diphthalic anhydride and pyromellitic dianhydride as dianhydrides, and then dissolving 4,4'-diaminodiphenyl ether, 4,4'-(hexafluoroisopropylidene)diphthalic anhydride and pyromellitic dianhydride in N-methylpyrrolidone, so as to form a first polyamic acid solution containing 10-14% of fluorine, wherein a solid content of the first polyamic acid solution is 10-14%;

coating the first polyamic acid solution on a surface of the glass baseplate; and heating a coating layer of the first polyamic acid solution, wherein a heating temperature is ramped up to 300-400° C. in accordance with a predetermined procedure, so as to cure the coating layer of the first polyamic acid solution to form the first polyimide layer; and the step S202 includes:

dissolving 9,9-bis(4-(4-amino-3-hydroxy)phenoxy)phenylfluorene and 4,4'-(hexafluoroisopropylidene)diphthalic anhydride of same moles in isoquinoline, so as to form a second polyamic acid solution, wherein the second polyamic acid solution includes polyamic acid and polyimide, and a solid content of the second polyamic acid solution is 13-17%; and then adding zirconium tetra-n-butoxy into the second polyamic acid solution, such that a ratio of polyimide to zirconium tetra-n-butoxy is 1:1.5;

coating the second polyamic acid solution on a surface of the first polyimide layer; and heating a coating layer of the second polyamic acid solution, wherein the heating temperature is ramped up to 300-350° C. in accordance with the predetermined procedure, so as to cure the coating layer of the second polyamic acid solution to form the second polyimide layer.

In accordance with one preferred embodiment of the present disclosure, the water and oxygen blocking layer is made of aluminum oxide having a low refractive index.

In a second aspect, the present disclosure provides a method for manufacturing a flexible substrate, including:

a step S10 of providing a glass baseplate;

a step S20 of forming at least two flexible substrate layers in a stacking form on a surface of the glass baseplate, wherein a first flexible substrate layer of the flexible substrate layers relatively close to the glass baseplate has a refractive index less than a refractive index of a second flexible substrate layer of the flexible substrate layers relatively far from the glass baseplate;

a step S30 of forming a water and oxygen blocking layer on a surface of the second flexible substrate layers, wherein the water and oxygen blocking layer has a refractive index greater than the refractive index of the second flexible substrate layers disposed below the water and oxygen blocking layer; and a step S40 of removing the glass baseplate, such that the flexible substrate having a high transmittance is formed.

In accordance with one preferred embodiment of the present disclosure, the flexible substrate layers are made of polyimide.

In accordance with one preferred embodiment of the present disclosure, the step S20 includes:

a step S201 of forming a first polyimide layer on a surface the glass baseplate; and a step S202 of forming a second polyimide layer on a surface of the first polyimide layer.

In accordance with one preferred embodiment of the present disclosure, the step S201 includes:

providing 4,4'-diaminodiphenyl ether as a diamine, and 4,4'-(hexafluoroisopropylidene)diphthalic anhydride and pyromellitic dianhydride as dianhydrides, and then dissolving 4,4'-diaminodiphenyl ether, 4,4'-(hexafluoroisopropylidene)diphthalic anhydride and pyromellitic dianhydride in N-methylpyrrolidone, so as to form a first polyamic acid solution containing 10-14% of fluorine, wherein a solid content of the first polyamic acid solution is 10-14%;

coating the first polyamic acid solution on the surface of the glass baseplate; and heating a coating layer of the first polyamic acid solution, wherein a heating temperature is ramped up to 300-400° C. in accordance with a predetermined procedure, so as to cure the coating layer of the first polyamic acid solution to form the first polyimide layer; and the step S202 includes:

dissolving 4,4'-(diphenylsulfonyl(4,1-benzene)disulfide)diphenylamine and 3,3',4,4'-biphenyltetracarboxylic dianhydride of same moles in N-methylpyrrolidone, so as to form a second polyamic acid solution, wherein a solid content of the second polyamic acid solution is 13-17%; coating the second polyamic acid solution on a surface of the first polyimide layer; and heating a coating layer of the second polyamic acid solution, wherein the heating temperature is ramped up to 300-350° C. in accordance with the predetermined procedure, so as to cure the coating layer of the second polyamic acid solution to form the second polyimide layer.

In accordance with one preferred embodiment of the present disclosure, the step S201 includes:

providing 4,4'-diaminodiphenyl ether as a diamine, and 4,4'-(hexafluoroisopropylidene)diphthalic anhydride and pyromellitic dianhydride as dianhydrides, and then dissolving 4,4'-diaminodiphenyl ether, 4,4'-(hexafluoroisopropylidene)diphthalic anhydride and pyromellitic dianhydride in N-methylpyrrolidone, so as to form a first polyamic acid solution containing 10-14% of fluorine, wherein a solid content of the first polyamic acid solution is 10-14%;

coating the first polyamic acid solution on the surface of the glass baseplate; and heating a coating layer of the first polyamic acid solution, wherein a heating temperature is ramped up to 300-400° C. in accordance with a predetermined procedure, so as to cure the coating layer of the first polyamic acid solution to form the first polyimide layer; and the step S202 includes:

dissolving 9,9-bis(4-(4-amino-3-hydroxy)phenoxy(phenylfluorene and 4,4'-(hexafluoroisopropylidene)diphthalic anhydride of same moles in isoquinoline, so as to form a second polyamic acid solution, wherein the second polyamic acid solution includes polyamic acid and polyimide, and a solid content of the second polyamic acid solution is 13-17%; and then adding zirconium tetra-n-butoxy into the second polyamic acid solution, such that a ratio of polyimide to zirconium tetra-n-butoxy is 1:1.5;

coating the second polyamic acid solution on a surface of the first polyimide layer; and heating a coating layer of the second polyamic acid solution, wherein the heating temperature is ramped up to 300-350° C. in accordance with the predetermined procedure, so as to cure the coating layer of the second polyamic acid solution to form the second polyimide layer.

In a third aspect, the present disclosure provides a flexible substrate, including:

a first flexible substrate layer;

a second flexible substrate layer disposed on a surface of the first flexible substrate layer; and a water and oxygen blocking layer disposed on a surface of the second flexible substrate layer;

wherein the first flexible substrate layer is configured as a light-incident side of the flexible substrate, and the water and oxygen blocking layer is configured as a light-emitting side of the flexible substrate, and wherein a refractive index of the first flexible substrate layer, a refractive index of the second flexible substrate layer, and a refractive index of the water and oxygen blocking layer are increased in turn.

In accordance with one preferred embodiment of the present disclosure, the first flexible substrate layer and the second flexible substrate layer are made of polyimide.

In accordance with one preferred embodiment of the present disclosure, the water and oxygen blocking layer is made of aluminum oxide having a low refractive index.

The present disclosure provides a flexible substrate and a method for manufacturing the same, which includes formation of a plurality of layers having different refractive indexes, so as to improve light transmittance of the flexible substrate. The present disclosure solves the problems encountered by the prior art, where the conventional process for manufacturing the flexible substrate, though light transmittance of the flexible substrate is increased, is much more complicated and requires much higher production cost, and does not satisfy requirements of scale-up production.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
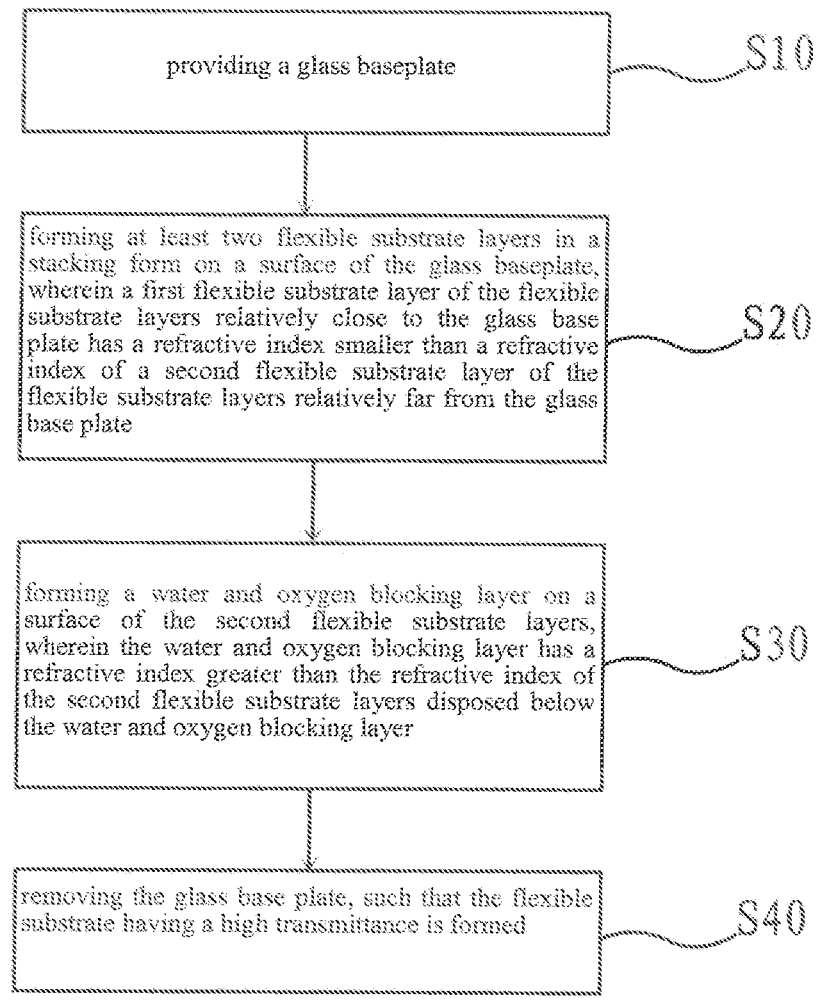
FIG. 1 is a schematic diagram showing a process flow of a method for manufacturing a flexible substrate according to the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure solves the problems encountered by the prior art, where the conventional process for manufacturing the flexible substrate, though light transmittance of the flexible substrate is increased, is much more complicated and requires much higher production cost, and does not satisfy requirements of scale-up production.

As shown in FIG. 1, a method for manufacturing a flexible substrate according to the present disclosure includes a step S10 of providing a glass baseplate.

Specifically, the glass baseplate is used as a base for manufacturing the flexible substrate. The glass baseplate can be replaced with other baseplate made of rigid materials (such as metal, plastic, and fiber), and could be a baseplate including the above mentioned materials and having a buffer layer.

Before the flexible substrate is formed on a surface of the glass baseplate, a sacrificial layer is formed on the glass baseplate. The sacrificial layer could be selected from an amorphous carbon film, a carbon nanotube film, a graphene film, a fullerene film, a diamond-like film, or any combination thereof. The sacrificial layer has a thickness of 1-1000 nm. Once electronic elements are formed on a surface of the flexible substrate, it is required to remove the glass baseplate from the flexible substrate. Since this might possibly cause physical or chemical damages to the surface of the flexible substrate, the sacrificial layer is configured to absorb damages caused to the flexible substrate while the glass baseplate is removed, thereby protecting the flexible substrate.

The method for manufacturing a flexible substrate according to the present disclosure further includes a step S20 of forming at least two flexible substrate layers in a stacking form, wherein a first flexible substrate layer of the flexible substrate layers relatively close to the glass baseplate has a refractive index less than a refractive index of a second flexible substrate layer of the flexible substrate layers relatively far from the glass baseplate.

Preferably, a thickness of each of the flexible substrate layers ranges from 1 μm to 100 μm. Specifically, a thickness of each of the flexible substrate layers ranges from 1 μm to 10 μm.

For example, the flexible substrate layers can be formed in the following way. A first flexible substrate layer is formed on a surface of the glass baseplate, and a second flexible substrate layer is formed on a surface of the first flexible substrate layer. The first flexible substrate layer has a refractive index less than a refractive index of the second flexible substrate layer.

Alternatively, a first flexible substrate layer is formed on a surface of the glass baseplate, a second flexible substrate layer is formed on a surface of the first flexible substrate layer, and a third flexible substrate layer is formed on a surface of the second flexible substrate layer. The first flexible substrate layer has a refractive index less than a refractive index of the second flexible substrate layer, and the second flexible substrate layer has the refractive index less than a refractive index of the third flexible substrate layer.

The flexible substrate layers are made of polyimide (PI).

The method for manufacturing a flexible substrate according to the present disclosure further includes a step S30 of forming a water and oxygen blocking layer on a surface of the second flexible substrate layers, wherein the water and oxygen blocking layer has a refractive index greater than the refractive index of the second flexible substrate layers disposed below the water and oxygen blocking layer.

The water and oxygen blocking layer is made of a material selected from silicon nitride (having a refractive index of 2.05), aluminum oxide (having a refractive index of 1.77), titanium oxide (having a refractive index of 2.65), zirconia (having a refractive index of 2.17), or any combination thereof. Preferably, the water and oxygen blocking layer is made of aluminum oxide having a low refractive index. In addition, the second flexible substrate layers has a refractive index less than a refractive index of the water and oxygen blocking layer, such that the overall refractive index of the flexible substrate is maintained at small values within a particular numerical range. The first flexible substrate layer is configured as a light-incident side of the flexible substrate, and the water and oxygen blocking layer is configured as a light-emitting side of the flexible substrate. A refractive index of the first flexible substrate layer, a refractive index of the second flexible substrate layer, and a refractive index of the water and oxygen blocking layer are increased in turn.

Preferably, the water and oxygen blocking layer has a thickness of 1-100 nm, more preferably 50 nm.

The method for manufacturing a flexible substrate according to the present disclosure further includes a step S40 of removing the glass baseplate, such that the flexible substrate having a high transmittance is formed.

A laser is used to remove the glass baseplate from the flexible substrate. Specifically, a laser generator emits a laser. The laser heats the glass baseplate on which a flexible substrate is formed. This makes one side of the flexible substrate contacting the glass baseplate decompose, and forces the flexible substrate to separate from the glass baseplate.

In the step of S20, there are two flexible substrate layers formed in a stacking form on the surface of the glass baseplate. Taking the flexible substrate layers made of polyimide (PI) as an example, the flexible substrate layers include a first polyimide layer formed on a surface of the glass baseplate and a second polyimide layer formed on a surface of the first polyimide layer.

For instance, the process for forming the first polyimide layer includes:

providing 4,4'-diaminodiphenyl ether (ODA) as a diamine, and 4,4'-(hexafluoroisopropylidene)diphthalic anhydride (6FDA) and pyromellitic dianhydride (PMDA) as dianhydrides, and then dissolving 4,4'-diaminodiphenyl ether, 4,4'-(hexafluoroisopropylidene)diphthalic anhydride and pyromellitic dianhydride in N-methylpyrrolidone (NMP), so as to form a first polyamic acid solution containing 10-14% (preferably 12%) of fluorine, wherein a solid content of the first polyamic acid solution is 10-14% (preferably 12%);

then coating the first polyamic acid solution on a surface of the glass baseplate; and finally, heating a coating layer of the first polyamic acid solution, wherein a heating temperature is ramped up to 300-400° C. (preferably 350° C.) in accordance with a predetermined procedure, so as to cure the coating layer of the first polyamic acid solution to form the first polyimide layer.

For instance, the process for forming the second polyimide layer includes:

dissolving 4,4'-(diphenylsulfonyl(4,1-benzene)disulfide) diphenylamine and 3,3',4,4'-biphenyltetracarboxylic dianhydride of same moles in N-methylpyrrolidone, and then stirring the solution, so as to form a second polyamic acid solution, wherein a solid content of the second polyamic acid solution is 13-17% (preferably 15%);

then coating the second polyamic acid solution on a surface of the first polyimide layer; and finally, heating a coating layer of the second polyamic acid solution, wherein the heating temperature is ramped up to 300-350° C. (preferably 320° C.) in accordance with the predetermined procedure, so as to cure the coating layer of the second polyamic acid solution to form the second polyimide layer.

The first polyimide layer formed thereby has a refractive index of 1.565 and a thickness of 10 μm. The second polyimide layer formed thereby has a refractive index of 1.668 and a thickness of 10 μm. Moreover, the overall reflectivity of the flexible substrate is 5.18%. In comparison thereto, a single-layer flexible substrate which is formed solely from a first polyimide layer and has a thickness of 20 μm has a reflectivity of 6.25%, and a single-layer flexible substrate which is formed solely from a second polyimide layer and has a thickness of 20 μm has a reflectivity of 5.37%. Therefore, a structure manufactured according to this present embodiment can achieve the functional effect of decrease in reflectivity and increase in transmittance.

Alternatively, while the process for forming the first polyimide layer is the same as the previous embodiment, the process for forming the second polyimide layer includes:

dissolving 9,9-bis(4-(4-amino-3-hydroxy)phenoxy)phenylfluorene (F-DA) and 4,4'-(hexafluoroisopropylidene) diphthalic anhydride (6FDA) of same moles in isoquinoline, and then stirring the solution, so as to form a second polyamic acid solution, wherein the second polyamic acid solution includes polyamic acid and polyimide, and a solid content of the second polyamic acid solution is 13-17% (preferably 15%); and then adding zirconium tetra-n-butoxy into the second polyamic acid solution, such that a ratio of polyimide to zirconium tetra-n-butoxy is 1:1.5;

then coating the second polyamic acid solution on a surface of the first polyimide layer; and finally, heating a coating layer of the second polyamic acid solution, wherein the heating temperature is ramped up to 300-350° C. (preferably 330° C.) in accordance with the predetermined procedure, so as to cure the coating layer of the second polyamic acid solution to form the second polyimide layer.

The first polyimide layer formed thereby has a refractive index of 1.565 and a thickness of 10 μm. The second polyimide layer formed thereby has a refractive index of 1.804 and a thickness of 10 μm. Moreover, the overall reflectivity of the flexible substrate is 5.82%. In comparison thereto, a single-layer flexible substrate which is formed solely from a first polyimide layer and has a thickness of 20 μm has a reflectivity of 8.69%, and a single-layer flexible substrate which is formed solely from a second polyimide layer and has a thickness of 20 μm has a reflectivity of 6.66%. Therefore, a structure manufactured according to this present embodiment can achieve the functional effect of decrease in reflectivity and increase in transmittance.

Figure 2:
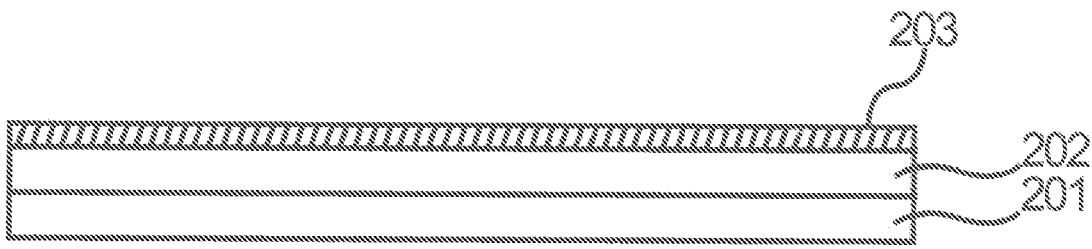
FIG. 2 is a schematic diagram showing a structure of a flexible substrate manufactured according to the present disclosure.

In accordance with the above objective, the present disclosure further provides a flexible substrate. As shown in FIG. 2, the flexible substrate includes: a first flexible substrate layer 201; a second flexible substrate layer 202 disposed on a surface of the first flexible substrate layer 201; and a water and oxygen blocking layer 203 disposed on a surface of the second flexible substrate layer 202. The first flexible substrate layer 201 is configured as a light-incident side of the flexible substrate, and the water and oxygen blocking layer 203 is configured as a light-emitting side of the flexible substrate. A refractive index of the first flexible substrate layer 201, a refractive index of the second flexible substrate layer 202, and a refractive index of the water and oxygen blocking layer 203 are increased in turn.

The flexible substrate in this preferred embodiment is manufactured by the method for manufacturing a flexible substrate described in the above embodiment. By referring to the above described embodiment, the method for manufacturing the flexible substrate can be understood, and thus is omitted.

Accordingly, the present disclosure provides a flexible substrate and a method for manufacturing the same, which includes formation of a plurality of layers having different refractive indexes, so as to improve light transmittance of the flexible substrate. The present disclosure solves the problems encountered by the prior art, where the conventional process for manufacturing the flexible substrate, though light transmittance of the flexible substrate is increased, is much more complicated and requires much higher production cost, and does not satisfy requirements of scale-up production.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A flexible substrate, comprising:
   a first flexible substrate layer made of polyimide;
   a second flexible substrate layer made of polyimide and directly disposed on an entire side surface of the first flexible substrate layer; and
   a water and oxygen blocking layer made of a material selected from silicon nitride, aluminum oxide, titanium oxide, zirconia, and any combination thereof and directly disposed on an entire side surface of the second flexible substrate layer away from the first flexible substrate layer;
   wherein the first flexible substrate layer is configured as a light-incident side of the flexible substrate, and the water and oxygen blocking layer is configured as a light-emitting side of the flexible substrate, and
   wherein a refractive index of the first flexible substrate layer, a refractive index of the second flexible substrate layer, and a refractive index of the water and oxygen blocking layer are increased in turn.

* * * * *